United States Patent [19]

McNeely et al.

[11] Patent Number: 4,582,952
[45] Date of Patent: Apr. 15, 1986

[54] GALLIUM ARSENIDE PHOSPHIDE TOP SOLAR CELL

[75] Inventors: James B. McNeely; Allen M. Barnett, both of Newark, Del.

[73] Assignee: Astrosystems, Inc., Newark, Del.

[21] Appl. No.: 605,791

[22] Filed: Apr. 30, 1984

[51] Int. Cl.$^4$ ............................................. H01L 31/06
[52] U.S. Cl. .................... 136/249; 136/262; 357/30
[58] Field of Search ................. 136/249 TJ, 261, 262; 357/30

[56] References Cited

U.S. PATENT DOCUMENTS

| | | | |
|---|---|---|---|
| 2,949,498 | 8/1960 | Jackson | 136/249 |
| 4,278,474 | 7/1981 | Blakeslee et al. | 136/249 |
| 4,295,002 | 10/1981 | Chappell | 136/244 |
| 4,338,480 | 7/1982 | Antypas et al. | 136/249 |

FOREIGN PATENT DOCUMENTS 0079790  5/1983  European Pat. Off. ................. 259/

OTHER PUBLICATIONS

D. L. Barton et al., "Solar Cells Based on GaP$_x$As$_{1-x}$ Compounds", *Conf. Record, 13th IEEE Photovoltaic Specialists Conf.* (1978), pp. 972-977.
J. C. C. Fan et al., "Optimal Design of High Efficiency Tandem Cells", *Proc. 16th IEEE Photovoltaic Specialists Conf.* (1982), pp. 692-701.
J. C. C. Fan et al., "High Efficiency Crystalline Tandem Cells", *Proc. SPIE*, vol. 407, pp. 73-87 (1983).
G. Sassi, "Theoretical Analysis of Solar Cells Based Upon Graded Band Gap Structures", *J. Appl. Phys.*, vol. 54, pp. 5421-5426 (1983).
R. L. Moon et al., "Continuous Compositional Grading by LPE in Al-Ga-V Quaternary Alloys", *Inst. Phys. Conf. Ser. No. 45*, Chap. I, pp. 78-88.

*Primary Examiner*—Aaron Weisstuch
*Attorney, Agent, or Firm*—Ratner & Prestia

[57] ABSTRACT

An improved tandem solar cell includes a gallium arsenide phosphide top solar cell and silicon bottom solar cell. The gallium arsenide phosphide solar cell is fabricated on a transparent gallium phosphide substrate and either placed in series with the silicon solar cell for a two terminal device or wired separately for a four terminal device. The top solar cell should have an energy gap between 1.77 and 2.09 eV for optimum energy conversion efficiency. A compositionally graded transition layer between the gallium phosphide substrate and the active semiconductor layers reduces dislocations in the active region. A gallium phosphide cap layer over the gallium arsenide phosphide solar cell reduces surface recombination losses.

13 Claims, 1 Drawing Figure

GALLIUM ARSENIDE PHOSPHIDE TOP SOLAR CELL

BACKGROUND OF THE INVENTION

A. Field of the Invention

This invention relates to the field of art of photovoltaic solar cells and especially tandem photovoltaic solar cells.

B. Background Art

A photovoltaic solar cell, often referred to as a solar cell, is a semiconductor device which converts light energy into electrical energy. Solar cells are useful for producing electrical energy in a variety of applications and environments. Among these, solar cells are particularly advantageous energy sources for use in space applications such as orbiting satellites, space vehicles and the like.

A consideration which critically affects the use of solar cells is energy conversion efficiency, that is, the ratio of light energy per unit time incident on a solar cell to the electrical energy per unit time produced by the cell. In general, the higher the conversion efficiency, the more useful the solar cell. Cost, ease of manufacture and reliability are also important.

An approach to achieving higher efficiency is described in U.S. Pat. No. 2,949,498 to E. D. Jackson. The Jackson patent discloses a multilayer solar cell with each layer having a p-n junction and being composed of a semiconductor material having a different energy gap than the other layers. The layers in the cell of Jackson are arranged to receive light in descending order of their energy gaps. Such cells are known in the art as tandem cells.

Tandem cells utilizing a silicon cell for the low energy gap cell and a III-V compound semiconductor for the upper, high energy gap cell are described by J. C. C. Fan et al. in the *Conference Record of the* 16th I.E.E.E. Photovoltaic Specialists Conference, p. 692 (1982) published by the Institute of Electrical and Electronics Engineers, New York, N.Y. According to Fan et al., the optimum energy gap, or band gap, for a top solar cell used in tandem with a silicon bottom cell having a band gap of 1.1 eV lies between 1.77 and 2.09 eV. This combination of band gaps relates to a theoretical efficiency of 32.9% at AMO and 27° C. for a four terminal tandem cell.

In an article by J. C. C. Fan et al. in *Photovoltaics for Solar Energy Applications II*, D. Adler, Editor, *Proceedings of SPIE*, Volume 407, pp. 73–87 (1983) published by the International Society of Optical Engineering, a two cell tandem structure is dislosed with a silicon bottom cell and $Ga_{1-x}Al_xAs$ or $GaAs_{1-x}P_x$ with x about 0.3 for the top cell.

U.S. Pat. No. 4,278,474 to A. E. Blakeslee et al. describes a monolithic series connected tandem cell having silicon for the bottom cell and gallium arsenide phosphide for the top cell with an intervening super lattice structure to block propogation of dislocation defects. Such a cell is difficult to fabricate and is limited to a two terminal configuration.

U.S. Pat. No. 4,338,480 to G. A. Antypas et al. discloses an AlGaAs cell stacked on top of a silicon cell. The AlGaAs cell of Antypas et al. is disclosed as being grown on a GaAs substrate. However, GaAs has an energy gap of about 1.43 eV and would prevent a significant amount of the light energy required for tandem cell operation from reaching the silicon bottom cell.

Furthermore, $Ga_{1-x}Al_xAs$ has proven not to be highly transparent to photons whose energy is less than the band gap. Another disadvantage of $Ga_{1-x}Al_xAs$ is that it is liable to oxidation and reaction with moisture. Still another disadvantage of $Ga_{1-x}Al_xAs$ is the difficulty in making low resistance ohmic electrical contact. Accordingly, advantages of tandem solar cells utilizing III-V alloy top cells have yet to be realized.

An object of this invention is a gallium arsenide phosphide top solar cell fabricated on a transparent gallium phosphide substrate and placed in electrical series with a silicon solar cell for a two terminal solar cell or wired separately for a four terminal tandem solar cell having high conversion efficiency.

Another object of this invention is to provide a gallium arsenide phosphide top cell having a transition layer between the gallium arsenide phosphide and the transparent gallium phosphide substrate in order to minimize dislocations.

Another object of this invention is to provide a gallium arsenide phosphide top cell having a gallium phosphide cap layer to minimize surface recombination.

SUMMARY OF THE INVENTION

A gallium arsenide phosphide top solar cell of a tandem solar cell has a transparent gallium phosphide substrate, and first and second active semiconductor layers with the composition $GaAs_{1-x}P_x$, where $x=0.18$ to 0.95, thereon. The active semiconductor layers are doped p and n type forming a junction therebetween. In one embodiment, a gallium arsenide phosphide transition layer of varying composition is provided between the substrate and the first active semiconductor layer in order to minimize dislocations. The gallium arsenide phosphide solar cell includes a transparent gallium phosphide cap, or window layer, over the second gallium arsenide phosphide active semiconductor layer. The gallium phosphide cap reduces surface recombination. The active semiconductor layers may be compositionally graded in order to obtain optimal conversion efficiency. Electrical contacts providing means for wiring the top cell in series or in a four terminal configuration with a silicon bottom cell completes the tandem cell.

DETAILED DESCRIPTION OF THE INVENTION

Figure 1:
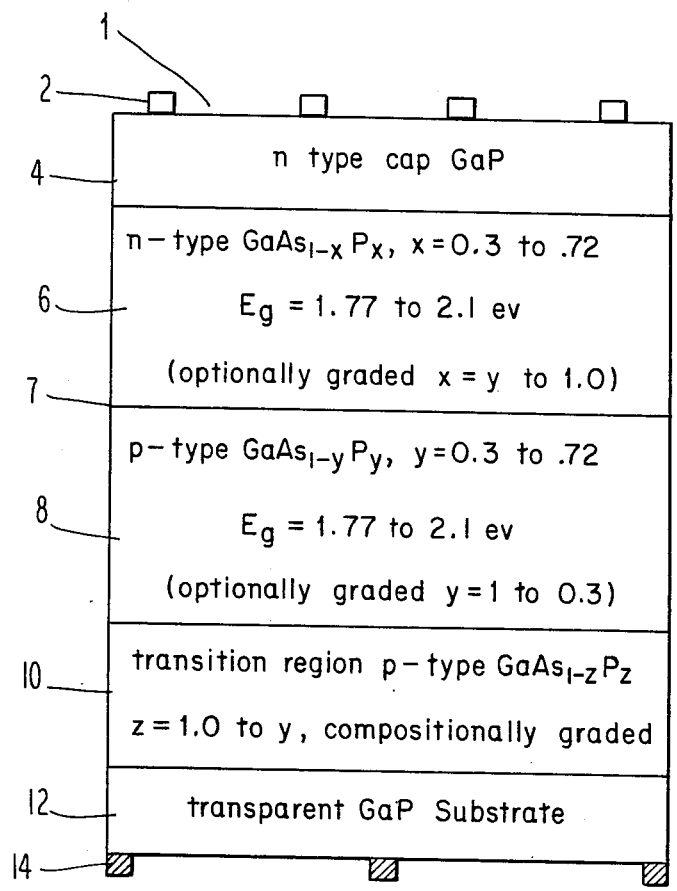
FIG. 1 is a schematic cross section, with portions enlarged, of a gallium arsenide phosphide top solar cell in accordance with this invention.

Shown in FIG. 1 is a schematic cross section of a gallium arsenide phosphide top solar cell in accordance with this invention.

Transparent substrate 12 is gallium phosphide, GaP, which in the preferred embodiment of this invention is doped p-type in the range $10^{17}$ to $10^{19}$ cm$^{-3}$. Zinc or germanium are preferred p-type dopants for GaP substrate 12. Substrate 12 should be of sufficient thickness to provide mechanical strength.

First active semiconductor layer 8 is gallium arsenide phosphide having the formula $GaAs_{1-y}P_y$ where $y=0.18$ to 0.95 falls within the teachings of this invention. The preferred composition of layer 8 corresponds to y being a value between 0.30, where the energy gap is 1.77 eV, and 0.72, where the energy gap is 2.1 eV. It is preferred that layer 8 be doped p-type to a level between $10^{17}$ and $10^{18}$ cm$^{-3}$. Zinc and germanium are suitable p-type dopants. The thickness of layer 8 should be between 2 and 6 micrometers.

Adjacent layer 8 is second active semiconductor layer 6. Layer 6 is gallium arsenide phosphide having the formula GaAs$_{1-x}$P$_x$ where x=0.18 to 0.95 falls within the teachings of this invention. The preferred composition of layer 6 corresponds to x being a value between 0.30, where the energy gap is 1.77 eV, and 0.72, where the energy gap is 2.1 eV. Layer 6 must be of opposite conductivity type from that of layer 8 in order to form p-n junction 7. Further, it is desirable to have the value of x and the value of y in contiguous regions of layers 6 and 8, respectively, equal or nearly equal to each other in order to minimize losses due to discontinuities in the conduction and valence bands. When layer 8 is doped p-type, layer 6 should be doped n-type to a level between $1\times 10^{18}$ and $5\times 10^{19}$ cm$^{-3}$. Tin and tellurium are suitable n-type dopants. The thickness of layer 6 should be between 0.05 and 0.5 micrometers. A thickness of 0.1 micrometers is preferred for layer 6. Adjacent layer 6 and opposite layer 8 is cap layer 4 having light incident surface 1 opposite the interface with layer 6. Layer 4 is GaP and has the same conductivity type and doping level as layer 6. The GaP of layer 4 has a large energy gap and permits the entry of incident light into the active portions of the cell. Layers serving this function are also known in the art as window layers. A further function of layer 4 is to reduce surface recombination and thereby enhance the conversion efficiency. The thickness of layer 4 can be between 0.05 and 1 micrometers. A thickness of 0.05 micrometers is preferred for layer 4.

Electrical contact to substrate 12 is made by first electrical contact 14. Contact 14 should be placed on substrate 12 so as to be transparent. As shown in FIG. 1 contact 14 is preferably in the form of a grid. When substrate 12 is p-type, contact 14 should be a material capable of making ohmic contact to p-type GaP. Such contact materials are known in the art. An alloy having the composition 94–96% by weight gold and 6–4% by weight zinc is a suitable material for contact 14.

Electrical contact to layer 4 is made by transparent second electrical contact 2. Contact 2 is disposed adjacent light receiving surface 1 and is in the form of a grid or other known pattern which permits transmission of incident light into the cell. The material of second contact 2 should be capable of ohmic contact to layer 4, when layer 4 is n-type GaP. An alloy having the composition 98% by weight gold and 2% by weight silicon is a suitable material for second contact 2.

In a preferred embodiment of this invention, a transition layer 10 is interposed between substrate 12 and first active semiconductor layer 8. Transition layer 10 is GaAs$_{1-z}$P$_z$ where the value of z varies between 1 and the value of y for layer 8. Transition layer serves to minimize dislocations in between the GaP substrate and active semiconductor layer 8 when the value of y for layer 8 is small. The compositional variation with layer 10 according to this invention is such that z=1 in the region closest to substrate 12 and z=y in the region closest layer 8. The manner in which the composition of layer 10 varies may be continuous or step-wise or both. The thickness of layer 10 should be between 1 and 20 micrometers, depending on extent of variation in composition In general, for large variations in compositions within layer 10 a thicker layer will be required. Layer 10 should have the same conductivity type and about the same doping levels that characterize layer 8 and substrate 12 in accordance with this invention.

The optimum energy gap for a top solar cell on a silicon bottom cell lies between 1.77 and 2.09 eV. The theoretical efficiency of a four terminal tandem cell of this type is 32.9% at AMO. If the maximum theoretical efficiency requirement is relaxed to just 32.0%, then the band gaps of the top cell range from 1.63 eV to 2.28 eV. These band gaps corresponding to gallium arsenide phosphide cells of this invention have the composition GaAs$_{0.82}$P$_{0.18}$ at 1.63 eV to GaP at 2.26 eV for active semiconductor layers 8 and 6. The optimum energy gap, and therefore composition, for maximum practical achievable efficiency is at a value where losses in cell and device performance are minimized. For example, propagated misfit dislocations is expected to reduce diffusion lengths in the active semiconductor layer 8. However, it is also expected that the minority carrier diffusion lengths increase with increased values of y in layer 8 because of reduced lattice mismatch between the active layer and the GaP substrate. Thus, increasing the value of y in layer 8 from y=0.3, where the corresponding energy gap is 1.77 eV, to y=0.72, where the energy gap is 2.1 eV, reduces the lattice mismatch from 2.8% to 1.1%. This reduction is expected to increase the minority carrier diffusion length while the corresponding increase in band gap has only a slight effect on overall efficiency.

Compositional grading of second active semiconductor layer 6 can result in an additional increase in efficiency. In accordance with this aspect of the invention, the composition variable x for layer 6 varies from x=1 in the region adjacent layer 4 to x=y for the region adjacent layer 8, where y is the value of the composition variable for layer 8. A greater efficiency increase contemplated by this invention can be achieved by compositional grading of both first active semiconductor layer 8 and second active semiconductor layer 6. The theoretical basis for efficiency improvements that are expected from compositional grading is set forth in an article by G. Sassi published in the *Journal of Applied Physics, Vol. 54, No. 9, p. 5421* (1983).

The preferred method for forming the cell in accordance with this invention is liquid phase epitaxial, LPE, growth. GaP substrates that are used in the manufacture of light emitting diodes may be employed. R. L. Moon et al. in *Proceedings of the 7th International Symposium on GaAs and Related Compounds, C. M. Wolf, Ed.,* (1978) *Institute of Physics, London, p. 78*, describe LPE growth of GaAs$_{0.6}$P$_{0.4}$ on GaP. LPE growth driven by applying a temperature or other gradient is described in *European Patent Office Publication Number 0 079 790, May 25, 1983* which is incorporated herein by reference. Smooth compositional grading of the Ga-As-P system by LPE on GaP is also known. The p-n junction and cap layer are also preferably grown by LPE.

In accordance with this invention, the solar cell of FIG. 1 is a multilayer structure formed on a transparent GaP substrate 12. First electrical contact 14 makes ohmic contact to substrate 12. Upon substrate 12 can be transition layer 10 or first active semiconductor layer 8. In any event, electrical contact between substrate 12 and layer 10 or layer 8 is of a non-rectifying nature. When layer 10 is employed in accordance with this invention, the electrical contact between it and layer 8 is also of a non-rectifying nature. Upon the opposing face of layer 8 is second active semiconductor layer 6 having an opposite conductivity type from that of layer 8 so that a p-n junction 7 exists between layers 8 and 6. Upon layer 6 and opposite junction 7 is cap layer 4 in non-rectifying contact with layer 6. Transparent electrical contact 2 is in ohmic contact with light receiving surface 1 of layer 2.

In the operation of the cell of this invention, light energy incident on light receiving surface 1 enters the cell through layer 4. An appropriate anti-reflection coating (not shown) known in the art may be applied over light receiving surface 1 in order to increase the amount of light energy entering the cell. For example, such coatings are described in European Pub. No. 0079790 as cited herein. Photons having an energy greater than the energy gap of the active semiconductor layers are absorbed in the cell and the light energy is converted into electrical energy. Light not absorbed in active layers passes through the substrate to be utilized by a silicon cell (not shown) having a lower energy gap. An additional anti-reflection coating known in the art may be applied to the free surface of substrate 12 in order to increase the amount of available light energy for the bottom silicon cell.

A tandem cell in accordance with this invention is accomplished by stacking the top cell of FIG. 1 over a silicon cell and electrically connecting the cells. Several means for combining cells in tandem are known in the art. For example, the aforementioned U.S. Pat. No. 4,338,480 to Antypas et al. describes stacking cells mechanically to form a series connected two terminal device. When a two terminal device is desired, electrical contact 14 is connected to the transparent contact of the underlying silicon cell. Transparent contact 2 and the second opaque electrical contact of the silicon cell are provided with means for externally electrically connecting the two terminal tandem cells. In accordance with this invention, a four terminal tandem cell is preferred. For such a cell separate electrical leads are attached to electrical contact 14 and transparent contact 2 and to the electrical contacts of the silicon cell.

The above cited two articles by J. C. C. Fan et al., the article by G. Sassi, the article by R. L. Moon et al., and U.S. Pat. No. 4,338,480 are all incorporated herein by reference.

What is claimed is:

1. In a tandem solar cell having a silicon solar cell for a low energy gap bottom cell and a high energy gap top cell, the improvement being a gallium arsenide phosphide top solar cell comprising:

a. a transparent gallium phosphide substrate;
   b. a first active semiconductor layer of $GaAs_{1-y}P_y$ and of a first conductivity type overlying said substrate;
   c. a second active semiconductor layer of $GaAs_{1-x}P_x$ and of a second conductivity type opposite said first conductivity type overlying and forming a photovoltaic junction therewith;
   d. a transparent first electrical contact in ohmic contact with said substrate; and
   e. a transparent second electrical contact in ohmic contact with said second active semiconductor layer.

2. The solar cell of claim 1 including a compositionally graded transition layer of $GaAs_{1-z}P_z$ interposed between said substrate and said first active layer whereby dislocations in said active semiconductor layers are minimized.

3. The solar cell of claim 2 including a gallium phosphide cap layer of said second conductivity type interposed between said second active semiconductor layer and said second transparent electrical contact whereby surface recombination is minimized.

4. The solar cell of claim 3 wherein said second active semiconductor layer is compositionally graded.

5. The solar cell of claim 4 wherein said first active semiconductor layer is compositionally graded.

6. The solar cell of claim 3 wherein said first conductivity type is p-type and said second conductivity type is n-type.

7. The solar cell of claim 3 wherein y of said first active semiconductor layer is in the range from 0.3 to 0.72 and x of said second active semiconductor layer is in the range from 0.3 to 0.72.

8. The solar cell of claim 3 wherein said first semiconductor layer is compositionally graded.

9. The solar cell of claim 2 wherein said compositionally graded transition layer is graded continuously.

10. The solar cell of claim 2 wherein said compositionally graded transition layer is graded in steps.

11. The solar cell of claim 2 wherein said first conductivity type is p-type and said second conductivity type is n-type.

12. The solar cell of claim 2 wherein y of said first active semiconductor layer is in the range from 0.3 to 0.72 and x of said second active semiconductor layer is in the range from 0.3 to 0.72.

13. The solar cell of claim 1 including a gallium phosphide cap layer of said second conductivity type interposed between said second active semiconductor layer and said second transparent electrical contact whereby surface recombination is minimized.

* * * * *